US007985490B2

(12) United States Patent
Lee et al.

(10) Patent No.: US 7,985,490 B2
(45) Date of Patent: Jul. 26, 2011

(54) COMPOSITION OF CONDUCTING POLYMER AND ORGANIC OPTO-ELECTRONIC DEVICE EMPLOYING THE SAME

(75) Inventors: Tae-Woo Lee, Seoul (KR); Jong-Jin Park, Guri-si (KR); O-Hyun Kwon, Seoul (KR); Sang-Hoon Park, Seongnam-si (KR); Joon-Yong Park, Yongin-si (KR); Dal-Ho Huh, Suwon-si (KR); Eun-Sil Han, Yongin-si (KR); Sang-Yeol Kim, Gwacheon-si (KR); Mu-Gyeom Kim, Hwaseong-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 1307 days.

(21) Appl. No.: 11/312,453

(22) Filed: Dec. 21, 2005

(65) Prior Publication Data
US 2006/0180810 A1    Aug. 17, 2006

(30) Foreign Application Priority Data

Feb. 14, 2005  (KR) .................. 10-2005-0012067
May 31, 2005  (KR) .................. 10-2005-0046165

(51) Int. Cl.
*H01B 1/12*  (2006.01)
(52) U.S. Cl. .................. 428/690; 257/40; 525/418
(58) Field of Classification Search .......... 428/690, 428/917; 313/502–509; 257/40, 88–103, 257/E51.001–E51.052; 525/418, 535, 538, 525/919
See application file for complete search history.

(56) References Cited

U.S. PATENT DOCUMENTS

| | | | | |
|---|---|---|---|---|
| 3,969,434 A * | 7/1976 | Powell et al. | ............ | 525/196 |
| 6,416,885 B1 * | 7/2002 | Towns et al. | ............ | 428/690 |
| 6,605,236 B1 * | 8/2003 | Smith et al. | ............ | 252/500 |
| 7,338,620 B2 * | 3/2008 | Hsu et al. | ............ | 252/500 |
| 2002/0011420 A1 * | 1/2002 | Roitman et al. | ........ | 205/419 |
| 2002/0025391 A1 * | 2/2002 | Angelopoulos et al. | ...... | 428/1.4 |
| 2003/0035917 A1 * | 2/2003 | Hyman | ............ | 428/67 |
| 2003/0062510 A1 * | 4/2003 | Van den Bogaert | ...... | 252/500 |
| 2004/0102577 A1 * | 5/2004 | Hsu et al. | ............ | 525/182 |
| 2004/0127637 A1 * | 7/2004 | Hsu et al. | ............ | 524/800 |
| 2004/0206942 A1 * | 10/2004 | Hsu | ............ | 252/500 |

OTHER PUBLICATIONS

Ding et. al., Enhanced Conductivity . . . Graft Polymers, 2002, Macromolecules 2002, pp. 1348-1355.*
Eisenbach et. al., Dynamic . . . Ionomer blends, 1994, Macromolecules, vol. 27, pp. 3162-3165.*
Chinese Office action issued on Jan. 15, 2010, corresponding to Korean Priority Application Nos. 2005-0012067 and 2005-0046165.

* cited by examiner

*Primary Examiner* — D. Lawrence Tarazano
*Assistant Examiner* — Gregory Clark
(74) *Attorney, Agent, or Firm* — Robert E. Bushnell, Esq.

(57) ABSTRACT

A composition including a conducting polymer and an ionomer, and an opto-electronic and an electronic device including the composition are provided. The composition is prepared by doping a conducting polymer with an ionomer which has a low water uptake, has a low content of by-products decomposed by a reaction with electrons, and can crosslink with the conducting polymer. Thus, the opto-electronic device including the composition has improved device performance such as device efficiency and lifetime.

30 Claims, 3 Drawing Sheets

COMPOSITION OF CONDUCTING POLYMER AND ORGANIC OPTO-ELECTRONIC DEVICE EMPLOYING THE SAME

CROSS-REFERENCE TO RELATED PATENT APPLICATION AND CLAIM OF PRIORITY

This application claims the benefit of Korean Patent Application Nos. 10-2005-0012067, filed on Feb. 14, 2005, and 10-2005-0046165, filed on May 31, 2005, in the Korean Intellectual Property Office, the disclosures of which are incorporated herein in its entirety by reference.

BACKGROUND OF THE INVENTION

1. Field of the Invention

The present invention relates to a composition of a conducting polymer and an organic opto-electronic and an organic electronic device employing the same. More particularly, the present invention relates to a composition including a conducting polymer doped with an ionomer, which has a low water uptake, has a low content of by-products (or impurities) produced by a decomposition reaction with electrons, and can physically crosslink with the conducting polymer, and an opto-electronic device having increased device performance such as device efficiency and lifetime by using the composition.

2. Description of the Related Art

Opto-electronic devices convert light energy into electric energy or electric energy into light energy, and examples thereof include organic electroluminescent devices, solar cells, and the like. Electronic devices use electrical current and voltage to modulate current with function of voltage or vice versa, and examples thereof include an organic transistor, an organic memory device and the like. At present, many studies regarding the formation of a conducting polymer film are being conducted to improve the device performance (or device current efficiency) of an opto-electronic device by efficiently transporting electronic charges injected from the electrodes of the device, i.e., holes and electrons into the device.

In particular, an organic electroluminescent device is an active device in which an electron and a hole recombine in a fluorescent or phosphorescent organic compound thin film (hereinafter referred to as an organic film) when an electric current is supplied to the organic film, thereby emitting light. Generally, the organic electroluminescent device has a multilayer structure including a hole injection layer using a conducting polymer, an emissive layer, an electron injection layer, etc., to improve the efficiency of the device and reduce a driving voltage, rather than having only the emissive layer as an organic layer.

An aqueous PEDOT (Poly(3,4-ethylene dioxythiopene))-PSS (poly(4-styrenesulfonate)) solution, which is commercially available as Baytron-P from Bayer AG, is widely used in the manufacture of an organic electroluminescent device to form a hole injection layer by spin coating it on an ITO (indium tin oxide) electrode. The PEDOT-PSS material has the following structure:

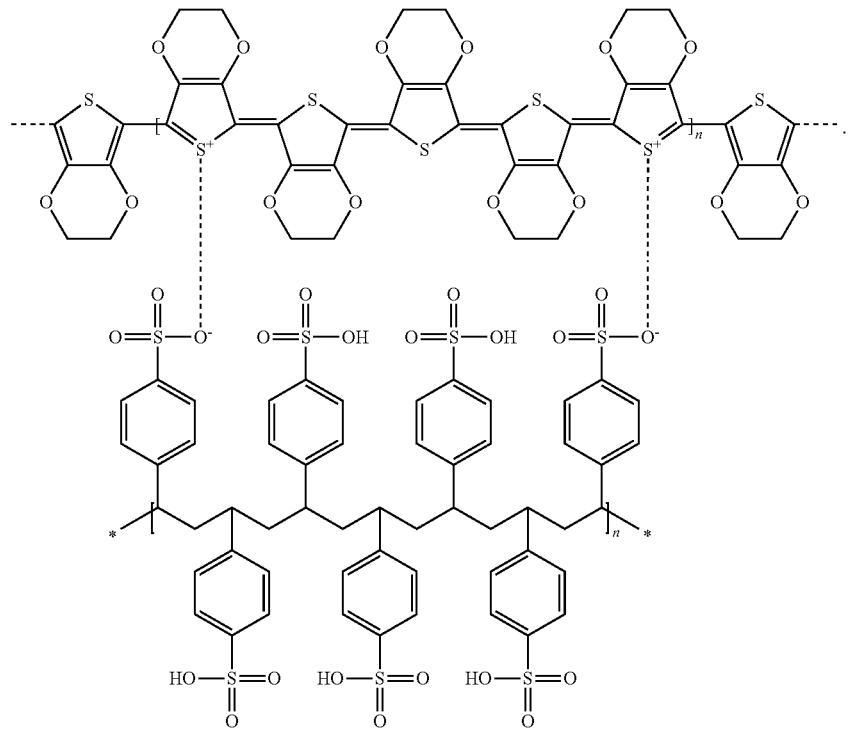

When a hole injection layer is formed using the composition including PEDOT as a conducting polymer doped with PSS as a polyacid, PSS absorbs moisture well, and thus it is not recommended to incorporate PSS into PEDOT when the removal of moisture is required. Further, PSS can be decomposed by reaction with electrons to release a by-product such as sulfate, which may be diffused to an adjacent organic film, for example, an emissive layer. PEDOT-PSS also contains other impurities of alkaline metals such as Na. This diffusion of the material derived from the hole injection layer to the emissive layer induces exciton quenching resulting in a reduction in the efficiency and lifetime of the organic electroluminescent device. In addition, the diffused by-products may initiate the formation of insoluble layer which was usually observed in polymer light-emitting diodes.

Thus, a demand for a novel composition of a conducting polymer is increasing to obtain satisfactory device efficiency and lifetime in an opto-electronic device such as an organic electroluminescent device.

SUMMARY OF THE INVENTION

The present invention provides a composition including a conducting polymer and an ionomer which has a low water uptake, has a low content of by-products produced by its decomposition reaction with electrons, and can crosslink with the conducting polymer.

The present invention also provides an opto-electronic device including a conducting thin film formed from the composition of conducting polymers.

The present invention also provides an opto-electronic device and an electronic device having improved device performances such as device efficiency and lifetime and charge transport mobility by including the composition of conducting polymers.

According to an aspect of the present invention, there is provided a composition including a conducting polymer and an ionomer represented by Formula (1)

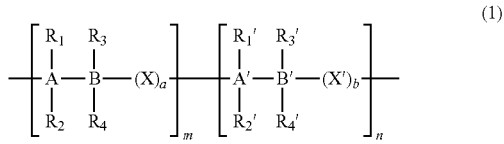

where $0 < m \leq 10,000,000$; $0 \leq n \leq 10,000,000$; $0 \leq a \leq 20$; $0 \leq b \leq 20$; each of A, B, A', and B' is independently selected from the group consisting of C, Si, Ge, Sn, and Pb; each of $R_1$, $R_2$, $R_3$, $R_4$, $R_1'$, $R_2'$, $R_3'$, and $R_4'$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 heteroalkyl group, a substituted or unsubstituted C1-C30 alkoxy group, a substituted or unsubstituted C1-C30 heteroalkoxy group, a substituted or unsubstituted C6-C30 aryl group, a substituted or unsubstituted C6-C30 arylalkyl group, a substituted or unsubstituted C6-C30 aryloxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C2-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C2-C30 heteroarylester group, and at least one of $R_1$, $R_2$, $R_3$, and $R_4$ is an ionic group or includes an ionic group; each of X and X' is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C5-C30 heterocycloalkylene group, a substituted or unsubstituted C6-C30 arylester group, and a substituted or unsubstituted C2-C30 heteroarylester group; and at least one of $R_1$, $R_2$, $R_3$, and $R_4$ is a hydrophobic functional group having a halogen element when n is 0.

According to another aspect of the present invention, there is provided a conducting thin film formed from the composition.

According to another aspect of the present invention, there is provided an opto-electronic device including the conducting thin film formed from the composition.

BRIEF DESCRIPTION OF THE DRAWINGS

A more complete appreciation of the present invention, and many of the above and other features and advantages of the present invention, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
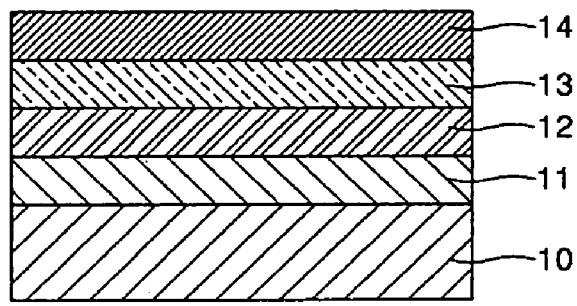
FIGS. 1a through 1d are schematic cross-sectional views of conventional organic electroluminescent devices.

According to an embodiment of the present invention, a composition is prepared by doping a conducting polymer with an ionomer which has a low water uptake, has a low content of by-products produced by the decomposition reaction with electrons, and can physically crosslink with the conducting polymer. Thus, an opto-electronic device including the composition has improved efficiency and lifetime.

The composition includes a conducting polymer and an ionomer represented by Formula 1:

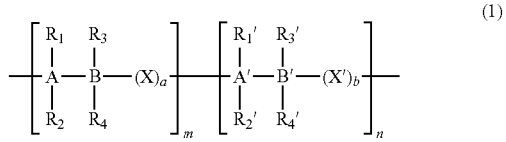

where $0 < m \leq 10,000,000$;
$0 \leq n < 10,000,000$;
$0 \leq a \leq 20$;
$0 \leq b \leq 20$;
each of A, B, A', and B' is independently selected from the group consisting of C, Si, Ge, Sn, and Pb;
each of $R_1$, $R_2$, $R_3$, $R_4$, $R_1'$, $R_2'$, $R_3'$, and $R_4'$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 heteroalkyl group, a substituted or unsubstituted C1-C30 alkoxy group, a substituted or unsubstituted C1-C30 heteroalkoxy group, a substituted or unsubstituted C6-C30 aryl group, a substituted or unsubstituted C6-C30 arylalkyl group, a substituted or unsubstituted C6-C30 aryloxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C2-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C2-C30 heteroarylester group, and at least one of $R_1$, $R_2$, $R_3$, and $R_4$ is an ionic group or includes an ionic group, and at least one of $R_1$, $R_2$, $R_3$, and $R_4$ is a hydrophobic functional group having a halogen element when n is 0; and each of X and X' is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C5-C30 heterocycloalkylene group, a substituted or unsubstituted C6-C30 arylester group, and a substituted or unsubstituted C2-C30 heteroarylester group.

The ionomer generally refers to a polymer including an ionic group and can be represented by Formula (1).

In the case of PEDOT/PSS, ionic groups ($SO_3H$) are substituted on all benzene groups on the backbone of PSS and a hydrophobic group is not included, resulting in high affinity to water. To reduce the affinity to water, it can be considered that the molar ratio of the ionic group to the backbone is reduced or hydrophobic functional groups having poor water uptake are introduced as substituents. Since the ionomer represented by Formula (1) includes an ionic group when n is 0, a hydrophobic functional group having a halogen element is introduced into the ionomer to provide lower water uptake than hydrocarbon and aromatic hydrocarbon. Therefore, at least one of hydrogen atoms on the backbone or branches of the ionomer is substituted with a hydrophobic functional group having a halogen element.

Examples of the hydrophobic functional group include a halogen atom, a halogenated C1-C30 alkyl group, a halogenated C1-C30 alkoxy group, a halogenated C1-C30 heteroalkyl group, a halogenated C1-C30 alkoxy group, a halogenated C1-C30 heteroalkoxy group, a halogenated C6-C30 aryl group, a halogenated C6-C30 arylalkyl group, a halogenated C6-C30 aryloxy group, a halogenated C2-C30 heteroaryl group, a halogenated C2-C30 heteroarylalkyl group, halogenated C2-C30 heteroaryloxy group, a halogenated C5-C20 cycloalkyl group, a halogenated C2-C30 heterocycloalkyl group, a halogenated C1-C30 alkylester group, a halogenated C1-C30 heteroalkylester group, a halogenated C6-C30 arylester group, and a halogenated C2-C30 heteroarylester group, preferably halogen atom, more preferably fluorine atom.

If 0<n<10,000,000, the ionomer has a copolymer form with a nonionic monomer having no ionic group, thereby reducing the content of the ionic group in the ionomer to an appropriate range and finally reducing the content of by-products produced by the decomposition reaction with electrons. Here, the content of the nonionic comonomer is 1 to 99 mol %, preferably 1 to 50 mol %, based on the total content of monomers. When the content of the comonomer is less than 1 mol %, the function of the nonionic group cannot be sufficiently carried out. When the content of the comonomer is greater than 99 mol %, doping cannot be sufficiently achieved due to a low content of the ionic group.

The composition of the present embodiment includes 100 to 5,000 parts by weight, preferably 200 to 1,700 parts by weight, of the ionomer represented by Formula (1) based on 100 parts by weight of the conducting polymer. When the content of the ionomer is less than 100 parts by weight, doping is not sufficiently achieved, dispersion is not easily carried out, and a poor thin film can be formed. When the content of the ionomer is greater than 3,000 parts by weight, conducting property is significantly reduced.

The conducting polymer may be polyethylenedioxythiopene (PEDOT), polyaniline, polypyrrole, polyacetylene, polyphenylene, polyphenylenevinylene, polythiopene, or a copolymer or blend of two or more of these materials. In particular, polyethylenedioxythiopene and polyaniline are preferable.

As described above, in Formula (1), at least one of $R_1$, $R_2$, $R_3$, and $R_4$ may be an ionic group or contain an ionic group. The ionic group includes a couple of anion and cation. Examples of anion include $PO_3^{2-}$, $SO_3^-$, $COO^-$, $I^-$, $CHOSO_3^-$, $CH_3COO^-$ and examples of cation include metal ions such as $Na^+$, $K^+$, $Li^+$, $Mg^{+2}$, $Zn^{+2}$, and $Al^{+3}$; and organic ions such as $H^+$, $CH_3(CH_2)_a NH_3^+$ in which a is an integer of 0 to 50, $NH_4^+$, $NH_2^+$, $NHSO_2CF_3^+$, $CHO^+$, $C_2H_5OH^+$, $CH_3OH^+$, $CH_3(CH_2)_n CHO^+$ in which R is an alkyl group, i.e., $CH_3(CH_2)_b^-$ wherein b is an integer of from 0 to 50.

To further improve the crosslinkability of the conducting polymer and the ionomer, the conducting polymer composition may further include a physical crosslinking agent and/or a chemical crosslinking agent.

The physical crosslinking agent refers to a low molecular compound or a high molecular compound having a hydroxy group (—OH), which functions as a physical bridge between polymer chains without chemical bond. Examples of the physical crosslinking agent include low molecular compounds, such as glycerol and butanol, and the high molecular compounds, such as polyvinylalcohol and polyethyleneglycol. Besides, polyethyleneimine and polyvinylpyrrolidone can also be used.

The content of the physical crosslinking agent is 0.001 to 50 parts by weight, preferably 0.1 to 10 parts by weight, based on 100 parts by weight of the composition. When the content of the physical crosslinking agent is less than 0.001 part by weight, the function of bridge cannot be sufficiently performed. When the content of the physical crosslinking agent is greater than 50 parts by weight, the thin film morphology of the conducting polymer film is poor.

The chemical crosslinking agent refers to a chemical material which chemically crosslinks compounds, can induce in-situ polymerization, and can form interpenetrating polymer network (IPN). Silane-based materials are mainly used, and an example thereof includes tetraethyloxysilane (TEOS). Besides, polyaziridine, melamine, and epoxy-based materials can be used.

The content of the chemical crosslinking agent is 0.001 to 50 parts by weight, preferably 0.1 to 10 parts by weight, based on 100 parts by weight of the composition. When the content of the chemical crosslinking agent is less than 0.001 part by weight, the function of bridge cannot be sufficiently performed. When the content of the chemical crosslinking agent is greater than 50 parts by weight, the conducting property of the conducting polymer is significantly deteriorated.

Examples of the ionomer represented by Formula (1) include ionomers represented by Formulae (2) to (13):

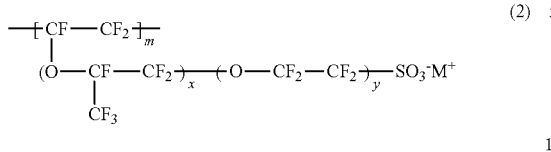
(2)

where m is a number of 1 to 10,000,000, each of x and y is dependently a number of 0 to 10, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

(3)

where m is a number of 1 to 10,000,000;

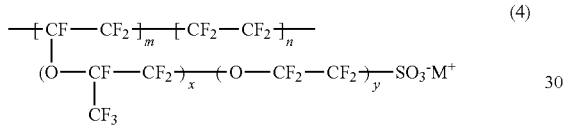
(4)

where $0<m\leq10,000,000$, $0\leq n<10,000,000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

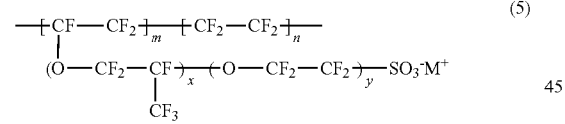
(5)

where $0<m\leq10,000,000$, $0\leq n<10,000,000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ wherein R is an alkyl group, i.e., $CH_3(CH_2)_b$— wherein b is an integer of 0 to 50;

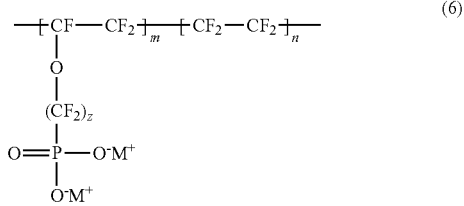
(6)

where $0<m\leq10,000,000$, $0\leq n<10,000,000$, z is a number of 0 to 20, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

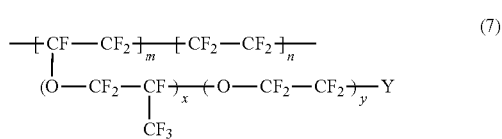
(7)

where $0<m\leq10,000,000$, $0\leq n<10,000,000$, each of x and y is independently a number of 0 to 20, Y is $-COO^-M^+$, $-SO_3^-NHSO_2CF_3^+$, or $-PO_3^{2-}(M^+)_2$, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

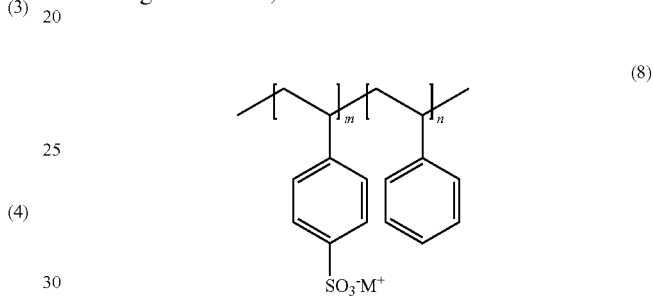
(8)

where $0<m\leq10,000,000$, $0\leq n<10,000,000$, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

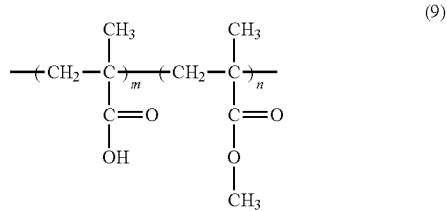
(9)

where $0<m\leq10,000,000$, and $0\leq n<10,000,000$;

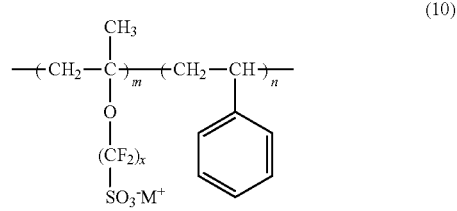
(10)

where $0<m\leq10,000,000$, $0\leq n<10,000,000$, x is a number of 0 to 20, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

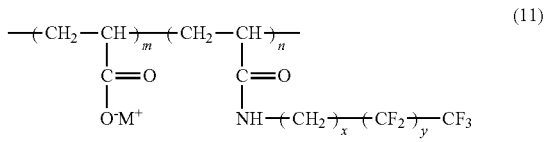

(11)

where $0<m\leq 10{,}000{,}000$, $0\leq n<10{,}000{,}000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$—; and n is an integer of 0 to 50;

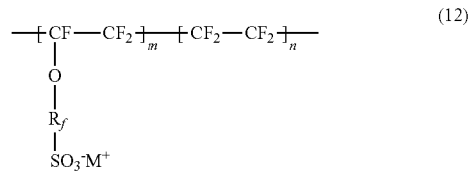

(12)

where $0<m\leq 10{,}000{,}000$, $0\leq n<10{,}000{,}000$, $R_f$ is —$(CF_2)_c$— in which c is an integer of 1 to 50, but is not 2, —$(CF_2CF_2O)_d$ $CF_2CF_2$— in which d is an integer of 1 to 50, or —$(CF_2CF_2CF_2O)_eCF_2CF_2$— in which e is an integer of 1 to 50, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50;

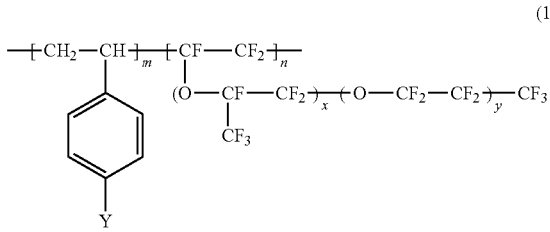

(13)

where $0<m\leq 10{,}000{,}000$, $0\leq n<10{,}000{,}000$, each of x and y is independently a number of 0 to 20, Y is —$SO_3^-M^+$, —$COO^-M^+$, —$SO_3^-NHSO_2CF3^+$, or —$PO_3^{2-}(M^+)_2$, and $M^+$ is $Na^+$, $K^+$, $Li^+$, $H^+$, $CH_3(CH_2)_aNH_3^+$ in which a is an integer of 0 to 50, $NH_4^+$, $NH_2^+$, $NHSO_2CF_3^+$, $CHO^+$, $C_2H_5OH^+$, $CH_3OH^+$, or $RCHO^+$ in which R is an alkyl group, i.e., $CH_3(CH_2)_b$— wherein b is an integer of 0 to 50.

Examples of the alkyl group include straight chain or branched chain methyl, ethyl, propyl, isobutyl, sec-butyl, tert-butyl, pentyl, iso-amyl, hexyl, etc. At least one hydrogen atom on the alkyl group may be substituted with a halogen atom, a hydroxy group, a nitro group, a cyano group, an amino group (—$NH_2$, —$NH(R)$, or —$N(R')(R'')$, in which each of R' and R'' is independently a C1-C10 alkyl group), an amidino group, a hydrazine group, or a hydrazone group.

The heteroalkyl group refers to the alkyl group in which at least one carbon atom, preferably 1 to 5 carbon atoms on the backbone are substituted with heteroatoms such as oxygen atom, sulfur atom, nitrogen atom, phosphorous atom, etc. The aryl group refers to a carbocyclic aromatic system containing one or more aromatic rings. The rings may be attached or fused together using a pendent method. Examples of the aryl group include aromatic groups such as phenyl, naphthyl, tetrahydronaphthyl, etc. At least one hydrogen atom of the aryl group can be substituted with the substituents of the alkyl group.

The heteroaryl group refers to a cyclic aromatic system including 1, 2, or 3 heteroatoms, preferably N, O, P, and S and having 5 to 30 ring members. The rings can be attached or fused together using a pendent method. At least one hydrogen atom of the heteroaryl group can be substituted with the substituents of the alkyl group.

The alkoxy group denotes a radical of —O-alkyl, in which the alkyl is as defined above. Examples of the alkoxy group include methoxy, ethoxy, propoxy, isobutyloxy, sec-butyloxy, pentyloxy, iso-amyloxy, hexyloxy, etc. At least one hydrogen atom of the alkoxy group can be substituted with the substituents of the alkyl group.

The heteroalkoxy group is the alkoxy group in which at least one, for example, oxygen, sulfur, or nitrogen is present in an alkyl chain, and examples of thereof include $CH_3CH_2OCH_2CH_2O$—, $C_4H_9OCH_2CH_2OCH_2CH_2O$—, and $CH_3O(CH_2CH_2O)_nH$.

The arylalkyl group is the aryl group in which some hydrogen atoms are substituted with lower alkyl radicals, for example, methyl, ethyl, and propyl. Examples of the arylalkyl group include benzyl and phenylethyl. At least one hydrogen atom of the arylalkyl group can be substituted with the substituents of the alkyl group.

The heteroarylalkyl group refers to the heteroaryl group in which some hydrogen atoms are substituted with lower alkyl groups. At least one hydrogen atom of the heteroarylalkyl group can be substituted with the substituents of the alkyl group.

The aryloxy group denotes a radical of —O-aryl, in which the aryl is as defined above. Examples of the aryloxy group include phenoxy, naphthoxy, anthracenyloxy, phenanthrenyloxy, fluorenyloxy, and indenyloxy. At least one hydrogen atom of the aryloxy group can be substituted with the same substituents as in the alkyl group.

The heteroaryloxy group denotes a radical of —O-heteroaryl, in which the heteroaryl is as defined above.

Examples of the heteroaryloxy group include benzyloxy and phenylethyloxy. At least one hydrogen atom of the heteroaryloxy group can be substituted with the substituents of the alkyl group.

The cycloalkyl group refers to a monovalent monocyclic system having 5-30 carbon atoms. At least one hydrogen atom of the cycloalkyl group can be substituted with the substituents of the alkyl group.

The heterocycloalkyl group a monovalent monocyclic system including 1, 2, or 3 hetero atoms, preferably N, O, P, and S and having 5-30 ring members. At least one hydrogen atom of the cycloalkyl group can be substituted with the substituents of the alkyl group.

The alkyl ester group refers to the alkyl group combined with an ester group.

The heteroalkylester group refers to the heteroalkyl group combined with an ester group.

The arylester group refers to the aryl group combined with an ester group.

The heteroarylester group refers to the heteroaryl group combined with an ester group.

The amino group represents —$NH_2$, —$NH(R)$ or —$N(R')(R'')$, in which each of R' and R'' is independently an alkyl group having 1-10 carbon atoms.

At least one hydrogen atom included in the above-mentioned substituents may be substituted with a halogen atom, preferably fluorine.

The composition of the present embodiment may further include a second ionomer in addition to the conducting polymer and the first ionomer. The second ionomer is preferably at least one type selected from ionomers represented by Formula (1), but may include ionomer forms other than the ionomers represented by Formula (1). Individual ionomers have different structures.

Examples of the second ionomer include hydrocarbon, fluorocarbon, and silicone polymers represented by Formula (1) in which $0<n<10{,}000{,}000$. The second ionomer may be at least one selected from the ionomers represented by Formulae (4) to (13).

Further examples of the second ionomer include hydrocarbon, fluorocarbon, and silicone polymers represented by Formula (1) in which $n=0$ and $0<m<10{,}000{,}000$. When the second ionomer is hydrocarbon, polystyrenesulfonate (PSS) is preferable. When the second ionomer is fluorocarbon, a perfluorinated ionomer is preferable. Such a perfluorinated ionomer may be an ionomer represented by Formula (2) or (3).

The amount of the second ionomer in the composition may likewise be 100 to 5,000 parts by weight, preferably 200 to 1,700 parts by weight, based on 100 parts by weight of the conducting polymer. When the amount of the second ionomer is less than 100 parts by weight, the effect of adding the second ionomer cannot be sufficiently obtained. When the amount of the second ionomer is greater than 5,000 parts by weight, conducting property is reduced.

The composition of the present invention can be used in an opto-electronic device. Examples of the opto-electronic device include an organic electroluminescent device, an organic solar cell, an organic transistor, and an organic memory device.

In particular, in the organic electroluminescent device, the composition of a conducing polymer is used in a charge injection layer, i.e., a hole or electron injection layer to inject efficiently holes or electrons into the light emitting polymer, thereby increasing the luminous intensity and the efficiency of the organic electroluminescent device.

In the organic solar cell, the conducting polymer is likewise used as an electrode or an electrode buffer layer to increase quantum efficiency, and in the organic transistor, it is also used as an electrode material in a gate, a source-drain electrode, etc.

An organic electroluminescent device employing the composition according to the present invention will now be described.

FIGS. 1a through 1d are schematic cross-sectional views of organic electroluminescent devices according to various embodiments of the present invention.

In the organic electroluminescent device illustrated in FIG. 1a, an emissive layer 12 is formed on a first electrode 10, a hole injection layer (HIL) (also referred to as "buffer layer") 11 is formed between the first electrode 10 and the emissive layer 12, a hole barrier layer (HBL) 13 is formed on the emissive layer 12, and a second electrode 14 is formed thereon.

Figure 1B:
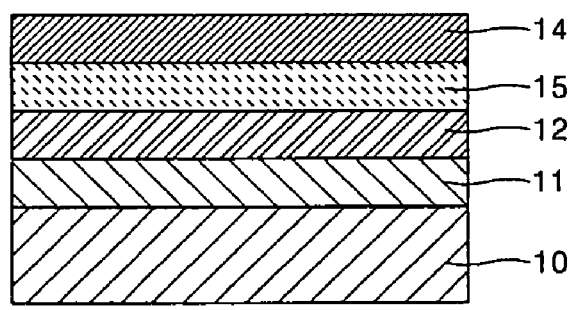

The organic electroluminescent device illustrated in FIG. 1b has the same structure as that of FIG. 1a, except that an electron transport layer (ETL) 15 instead of the hole barrier layer (HBL) 13 is formed on the emissive layer 12.

Figure 1C:
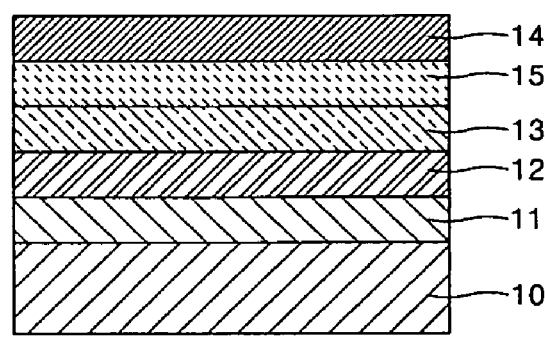

The organic electroluminescent device illustrated in FIG. 1c has the same structure as that of FIG. 1a, except that a hole barrier layer (HBL) 13 and an ETL 15, which are sequentially formed, instead of the hole barrier layer (HBL) 13 is formed on the emissive layer 12.

Figure 1D:
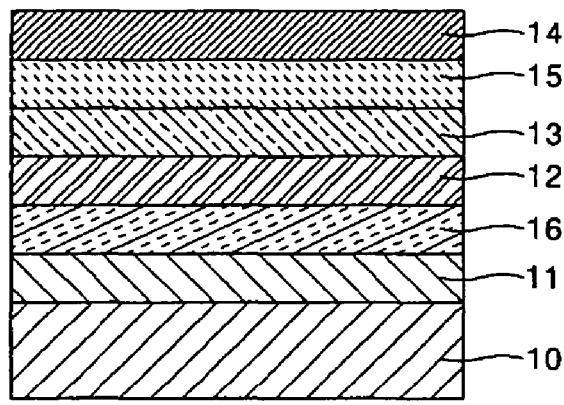

The organic electroluminescent device illustrated in FIG. 1d has the same structure as that of FIG. 1c, except that a hole transport layer (HTL) 16 is further formed between the HIL 11 and the emissive layer 12. The HTL 16 prevents penetration of impurities from the HIL 11 to the emissive layer 12.

The organic electroluminescent devices having the structures as illustrated in FIGS. 1a through 1d can be manufactured using typical methods, which are not particularly restricted.

A method of manufacturing an organic electroluminescent device according to an embodiment of the present invention will now be described.

A first patterned electrode 10 is first formed on a substrate (not shown). The substrate is a substrate used in the conventional organic electroluminescent device and may be a glass substrate or a transparent plastic substrate having good manageability and water proofness. The thickness of the substrate may be 0.3 to 1.1 mm.

A material for the first electrode 10 is not particularly restricted. If the first electrode is a cathode, the cathode is composed of a conducting metal or an oxide thereof, which makes it easy to inject holes. Examples of such a material include Indium tin oxide (ITO), indium zinc oxide (IZO), Ni, Pt, Au, Ir, etc.

The substrate having the first electrode 10 formed thereon is washed, and then is subjected to a UV and ozone treatment. When the substrate is washed, an organic solvent such as isopropanol (IPA) or acetone is used.

The HIL 11 including the composition of the present invention is formed on the first electrode 10 of the washed substrate. The formation of HIL 11 reduces contact resistance of the first electrode 10 and the emissive layer 12 and improves the hole transport ability of the first electrode 10 to emissive layer 12, thereby improving the driving voltage and the lifetime of the organic electroluminescent device.

The HIL 11 is formed by spin coating a HIL forming composition, which is prepared by dissolving (or dispersing) the composition of the present invention in a solvent (or medium), on the first electrode 10 and drying it. The HIL forming composition is used in a form diluted to 0.5 to 10% by weight by dissolving (or dispersing) the conducting polymer composition in a solvent (or medium) such as water, alcohol, other organic solvents or mixed solvents which are composed of the above-mentioned conducting polymer and an ionomer in a weight ratio of 1:1 to 1:30 in a solvent (or medium)

The solvent may be any solvent that can dissolve (or disperse) the composition of a conducting polymer and examples thereof include water, alcohol, dimethylformamide (DMF), toluene, xylene, and chlorobenzene.

The thickness of the HIL 11 may be 5 to 100 nm, preferably 20 to 70 nm, more preferably 50 nm. When the thickness of the HIL is less than 5 nm, injection of holes is not fully performed. When the thickness of the HIL is greater than 100 nm, light transmittance may be reduced.

The emissive layer 12 is formed on the HIL 11. A material for the emissive layer is not particularly restricted, but examples thereof include oxadiazole dimer dyes (Bis-DAPOXP), spiro compounds (Spiro-DPVBi, Spiro-6P), triarylamine compounds, bis(styryl)amine (DPVBi, DSA), FIrpic, CZTT, Anthracene, TPB, PPCP, DST, TPA, OXD-4, BBOT, AZM-Zn, etc. which are blue materials, Coumarin 6, C545T, Quinacridone, Ir(ppy)$_3$, etc., which are green materials, and DCM1, DCM2, Eu(thenoyltrifluoroacetone)3 (Eu (TTA)3), butyl-6-(1,1,7,7-tetramethyljulolidyl-9-enyl)-4H-pyran (DCJTB), etc., which are red materials. In addition, examples of the polymer light-emitting material include polymers such as phenylene, phenylene vinylene, thiophene, fluorene, and spiro-fluorene-based polymers and aromatic compounds containing nitrogen, but are not limited thereto.

The thickness of the emissive layer 12 may be 10 to 500 nm, preferably 50 to 120 nm. In particular, a blue emissive layer may have a thickness of 70 nm. When the thickness of the emissive layer is less than 10 nm, leakage current increases, resulting in a reduction in efficiency and lifetime. When the thickness of the emissive layer is greater than 500 nm, driving voltage is significantly increased.

The emissive layer forming composition further includes a dopant, if necessary. The amount of the dopant varies depending on a material for the emissive layer, but may be generally 30 to 80 parts by weight based on 100 parts by weight of a material for the emissive layer (total weight of the host and the dopant). When the amount of the dopant is not within the range, the luminous characteristics of an electroluminescent display device are reduced. Examples of the dopant include arylamine, perylenes, pyrroles, hydrazones, carbazoles, stylbenes, starburstes, oxadiazoles and derivatives thereof.

The HTL 16 may be optionally formed between the HIL 11 and the emissive layer 12.

A material for the HTL is not particularly restricted, but may be selected from a compound having a carbazole group and/or an arylamine group, which transport holes, a phthalocyanine-based compound, and a triphenylene derivative. More particularly, the HTL may be composed of at least one material selected from the group consisting of 1,3,5-tricarbazolylbenzene, 4,4'-biscarbazolylbiphenyl, polyvinylcarbazole, m-biscarbazolylphenyl, 4,4'-biscarbazolyl-2,2'-dimethylbiphenyl, 4,4',4"-tri(N-carbazolyl)triphenylamine, 1,3,5-tri(2-carbazolylphenyl)benzene, 1,3,5-tris(2-carbazolyl-5-methoxyphenyl)benzene, bis(4-carbazolylphenyl)silane, N,N'-bis(3-methylphenyl)-N,N'-diphenyl-[1,1-biphenyl]-4,4'-diamine (TPD), N,N'-di(naphthalene-2-yl)-N,N'-diphenyl benzidine (α-NPD), N,N'-diphenyl-N,N'-bis(1-naphthyl)-(1,1'-biphenyl)-4,4'-diamine (NPB), IDE320 (Idemitsu), poly (9,9-dioctylfluorene-co-N-(4-butylphenyl)diphenylamine (TFB), and poly(9,9-dioctylfluorene-co-bis-N,N-phenyl-1,4-phenylenediamine) (PFB), but are not limited thereto.

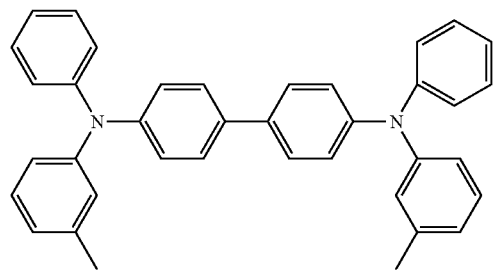

TPD

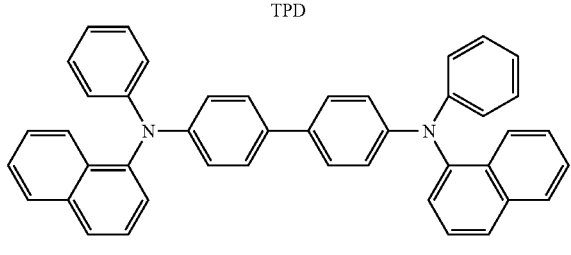

α-NPD

The HTL may have a thickness of 1 to 100 nm, preferably 5 to 50 nm, more preferably 30 nm. When the thickness of the HTL is less than 1 nm, the hole transport ability can be reduced. When the thickness of the HTL is greater than 100 nm, the driving voltage can be increased.

The HBL 13 and/or the ETL 15 are formed on the emissive layer 12 using a deposition or spin coating method. The HBL 13 prevents migration of excitons from the light emitting material to the ETL 15 or migration of holes to the ETL 15.

The HBL 13 may be composed of phenanthrolines (e.g., BCP available from UDC), imidazoles, triazoles, oxadiazoles (e.g., PBD), aluminium complex (available from UDC), or BAlq having the following structure:

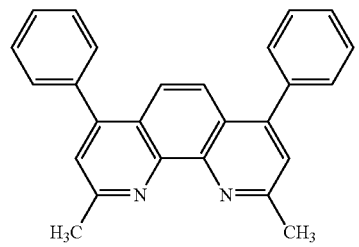

Compound containing phenanthroline

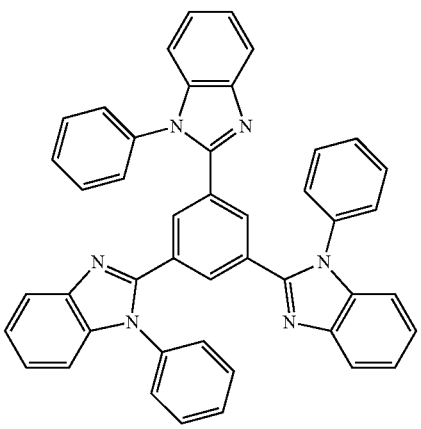

Compound containing imidazole

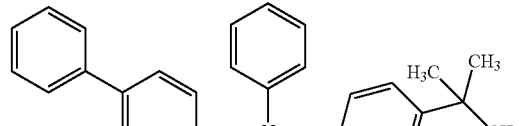

Compound containing triazole

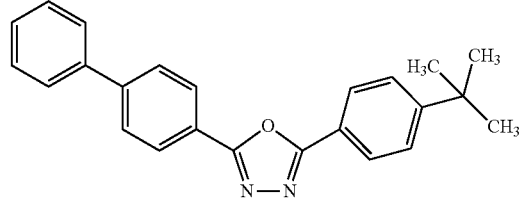

Compound containing oxadiazole

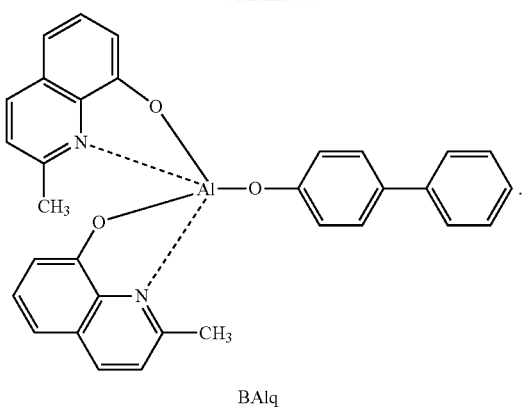
BAlq
The ETL 15 may be composed of oxazoles, isoxazoles, triazoles, isothiazoles, oxadiazoles, thiadiazoles, perylenes, aluminium complexes (e.g., Alq3 (tris(8-quinolinolato)-aluminium), BAlq, SAlq, Almq3), gallium complexes (e.g., Gaq'2OPiv, Gaq'2OAc, 2(Gaq'2)).
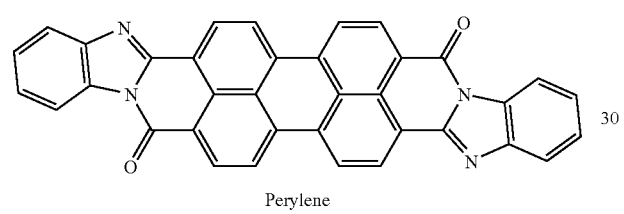
Perylene
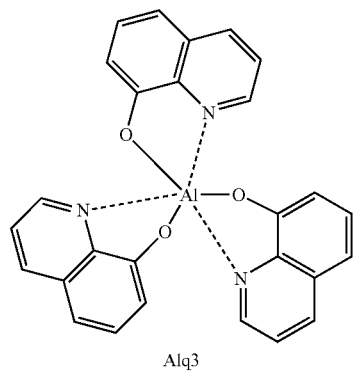
Alq3
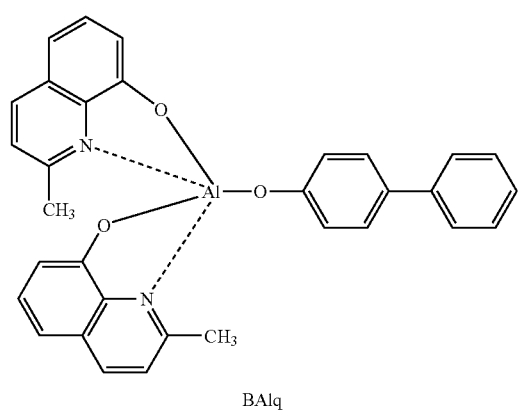
BAlq
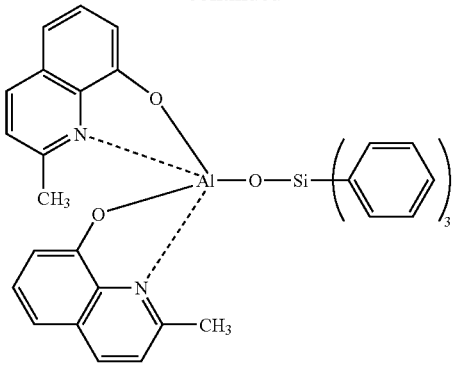
SAlq
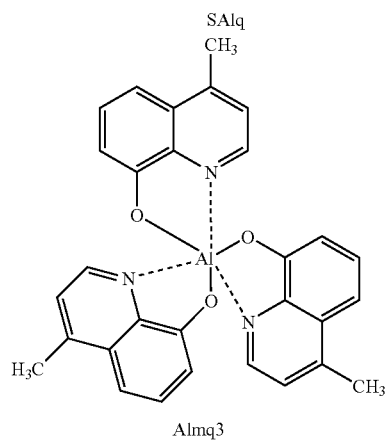
Almq3
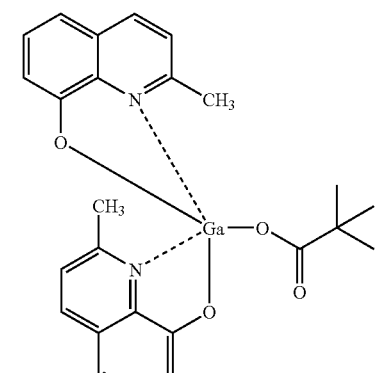
Gaq'2OPiv
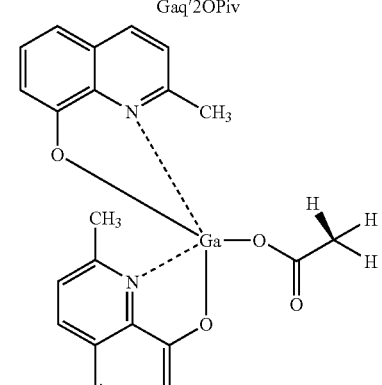
Gaq'2Oac 17
-continued

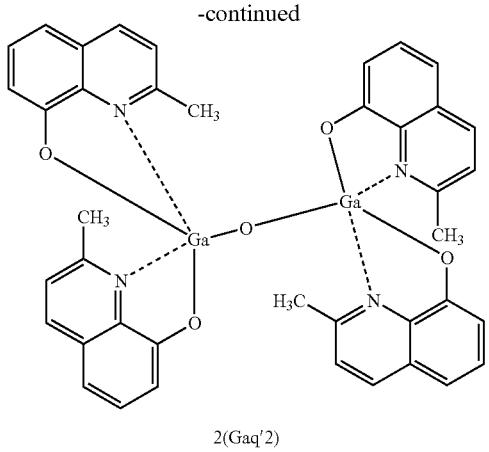

2(Gaq'2)

The thickness of the HBL may be 5 to 100 nm and the thickness of the ETL may be 5 to 100 nm. When the thickness of the HBL and the thickness of the ETL are not within the ranges, an electron transport ability and a hole barrier ability are poor.

Then, the second electrode 14 is formed on the resultant and sealed to complete an organic electroluminescent device.

A material for the second electrode 14 is not particularly restricted, but may be a metal having low work function, i.e., Li, Cs, Ba, Ca, Ca/Al, LiF/Ca, LiF/Al, BaF$_2$/Ca, Mg, Ag, Al, or an alloy thereof, or a multilayer thereof. The thickness of the second electrode 14 may be 50 to 3000 Å.

The organic electroluminescent device of the present invention does not require a particular apparatus or a method for manufacturing it and can be manufactured using a conventional manufacturing method.

The present invention will now be described in greater detail with reference to the following examples. The following examples are for illustrative purposes only and are not intended to limit the scope of the invention.

Example 1

Composition of PEDOT Conducting Polymer and Ionomer

An ionomer represented by Formula (14) available from DOW CHEMICAL was dissolved of a mixed solvent (water:ethanol=4:6) to obtain a solution including 1.0 wt % of the ionomer. PEDOT was then polymerized according to a known synthesis method (Greonendaal et al. Advanced Materials, Vol. 12, p 481, 2000 which is incorporated herein by reference). More particularly, 3,4-ethylenedioxythiopene (EDOT) commercially available as Baytron M manufactured by H. C. Starck was polymerized in a ratio of 10 wt % with respect to the weight of the ionomer represented by Formula (14) in the solution by oxidative chemical polymerization to complete the desired composition.

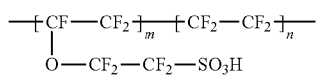

(14)

in which m=2, and n=5 to 11.

18

Example 2

Composition of PANI Conducting Polymer and Ionomer

An ionomer represented by Formula (15) available from DuPont was dissolved in a mixed solvent (water:ethanol=4:6) to obtain a solution including 1.0 wt % of the ionomer. Polyaniline (PANI) available from Sigma Aldrich was then doped with camphor sulfonic acid to obtain a conducting polymer. Subsequently, PANI and the solution including 1.0 wt % of the ionomer represented by Formula (15) were mixed in a weight ratio of 10:2 to complete the desired composition.

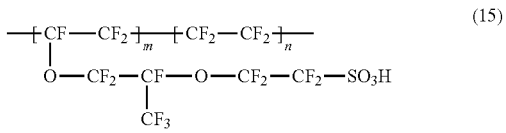

(15)

in which m=1 and n=5 to 11.

Example 3

Composition of PEDOT Conducting Polymer and Ionomer

1) Synthesis of Ionomer

A compound represented by Formula (16) was synthesized as follows. Polystyrene with a weight average molecular weight of 230,000 (number average molecular weight of 140,000) was purchased from Sigma Aldrich. Sulfonation of polystyrene was performed using acetyl sulfate as a sulfonation agent in 1,2-dichloroethane at 50° C. Sulfonate polymer was obtained by steam stripping and the remaining solvent was removed by drying in a vacuum oven at 60° C. for 2 days. A sulfonate content of the resulting polymer corresponded to 50 mol % of a polystyrene backbone.

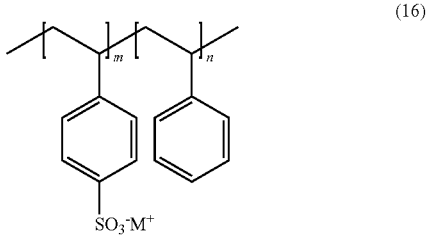

(16)

in which m=66, n=66, and M$^+$ is H$^+$.

2) Preparation of Composition

The ionomer synthesized above was dissolved in water to obtain a solution of 1.5 wt % ionomer. Then, EDOT was polymerised in the same manner as in Example 1 and was mixed with the solution of 1.5 wt % ionomer in a weight ratio of 15:2 to complete the desired composition.

Example 4

Manufacturing of Organic Electroluminescent Device

A Corning 15 Ω/cm$^2$ (1200 Å) ITO glass substrate was cut to a size of 50 mm×50 mm×0.7 mm and was ultrasonically washed in isopropyl alcohol and pure water, respectively, for 5 min, and then washed with UV and ozone for 30 min.

2 wt % of the aqueous conducting polymer solution prepared in Example 1 was spin coated on the substrate to form a 50 nm thick HIL. PFB (hole transport material was spin coated on the HIL to form a 10 nm thick HTL.

Spirofluorene-based light emitting polymer, which was a blue light emitting material, was used to form a 70 nm thick emissive layer on the HTL. Then, $BaF_2$ was deposited on the emissive layer to form a 4 nm thick EIL. A 2.7 nm thick Ca and a 250 nm thick Al were formed on the EIL as a second electrode to complete an organic electroluminescent device. This organic electroluminescent device was called Sample A.

Comparative Example 1

An organic electroluminescent device was manufactured in the same manner as in Example 4, except that a PEDOT/PSS aqueous solution commercially available as Batron P 4083 manufactured by Bayer was used as a material for the HIL. The obtained organic electroluminescent device was called Sample B.

Experimental Example 1

Evaluation of Efficiency

The efficiency of Sample A and Sample B was determined using a SpectraScan PR650 spectroradiometer.

Sample A exhibited an efficiency of 15 cd/A and Sample B exhibited an efficiency of 10 cd/A. Thus, an increase in efficiency of 50% was obtained.

Accordingly, it can be seen that the organic electroluminescent device having a HIL composed of the composition of the present invention has good luminous efficiency.

Experimental Example 2

Evaluation of Lifetime

The lifetime of Sample A and Sample B was investigated. The lifetime was determined by measuring luminance with respect to time using a photodiode and was represented by a time at which an initial luminance was reduced to 50%.

Sample A had a lifetime of about 1000 hrs and Sample B had a lifetime of about 400 hrs when they were operated at an initial luminance of 800 cd/m$^2$. Thus, the organic electroluminescent device of the present invention had a lifetime approximately 150% higher than that of the conventional organic electroluminescent device.

Example 5

Composition of PEDOT Conducting Polymer and Ionomer

An ionomer represented by Formula (17) (the so-called NAFION) was purchased from Sigma-Aldrich Co. as a solution of 5 wt % ionomer in a mixed solvent (water:2-propanol=4.5:5.5). Then, Baytron P H (composition of PEDOT and PSS in a weight ratio of 1:2.5) available from H. C. Starck was dissolved in a mixed solvent of water and ethanol to prepare a solution including 1.5 wt % of solids. The NAFION and the Baytron P H were mixed with each other in a weight ratio of 4:1, 2:1 and 1:1 to prepare the desired compositions.

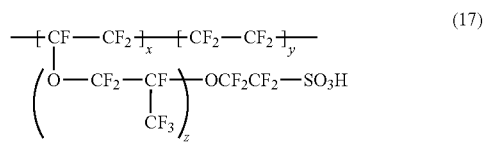

in which x=1, y=5 to 11, and z=1.

Example 6

Manufacturing of Organic Electroluminescent Device

A Corning 15 Ω/cm$^2$ (1200 Å) ITO glass substrate was cut to a size of 50 mm×50 mm×0.7 mm and was ultrasonically washed in isopropyl alcohol and pure water, respectively, for 5 min and then washed with UV and ozone for 30 min.

1.5 wt % of three types of aqueous conducting polymer solutions prepared in Example 5 was spin coated on the substrate to from a 50 nm thick HIL. Spirofluorene-based light emitting polymer, which was a blue light emitting material, was used to form a 70 nm thick emissive layer on the HIL. Then, $BaF_2$ was deposited on the emissive layer to form a 4 nm thick EIL. A 2.7 nm thick Ca and a 250 nm thick Al were formed on the EIL as a second electrode to complete an organic electroluminescent device. Organic electroluminescent devices having the weight ratio of Baytron P H and Nafion of 4:1, 2:1, and 1:1 were respectively called Sample C, Sample D, and Sample E.

Comparative Example 2

An organic electroluminescent device was manufactured in the same manner as in Example 6, except that a PEDOT/PSS (weight ratio 1/6) aqueous solution commercially available as Batron P 4083 manufactured by Bayer was used as a material for the HIL. This organic electroluminescent device was called Sample F.

Comparative Example 3

An organic electroluminescent device was manufactured in the same manner as in Example 6, except that a PEDOT/PSS (weight ratio 1/2.5) aqueous solution commercially available as Batron P H manufactured by Bayer was used as a material for the HIL. This organic electroluminescent device was called Sample G.

Experimental Example 3

Evaluation of Efficiency

Figure 2A:
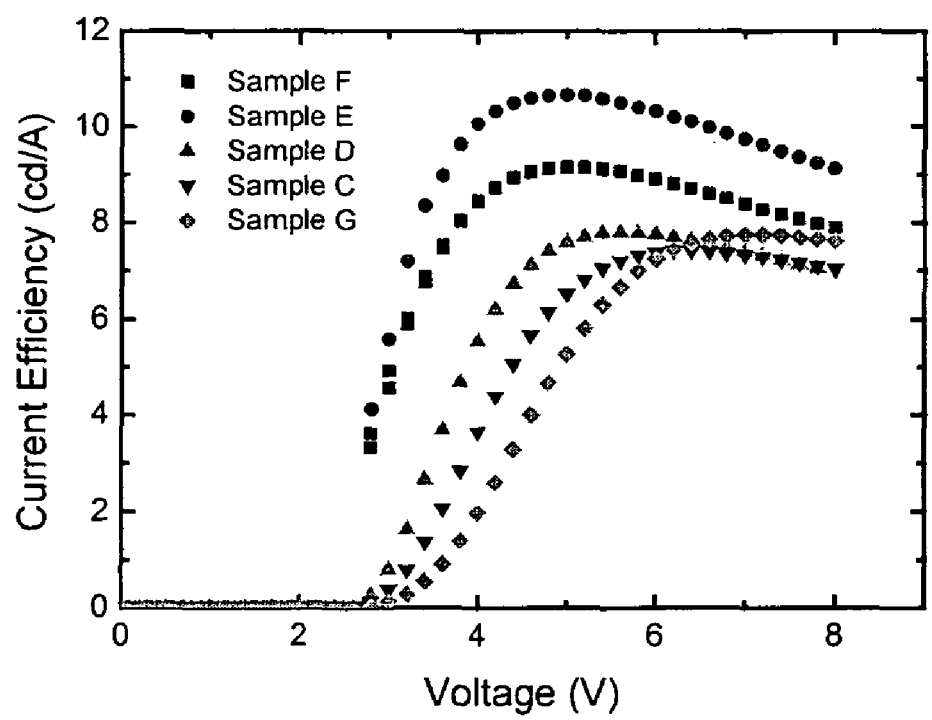
FIG. 2 is a graph illustrating the efficiency characteristics of organic electroluminescent devices manufactured in Example 1 and Comparative Example 1.
Figure 2B:
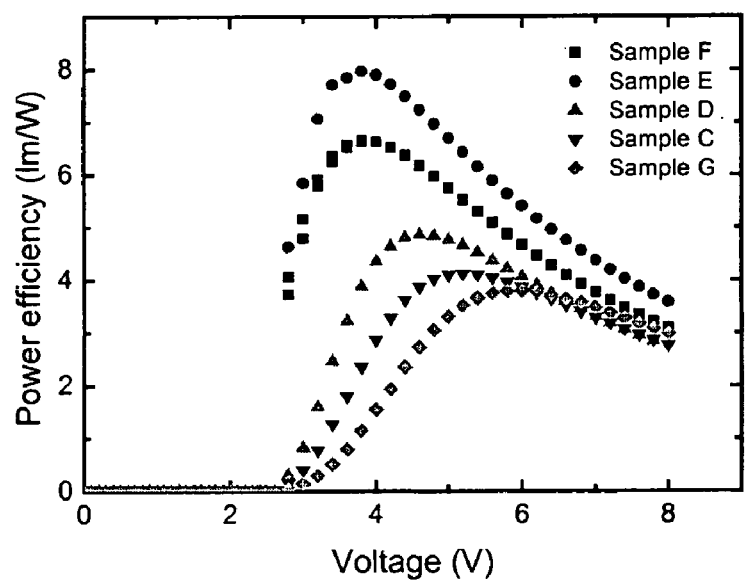

The efficiency of Sample C to Sample G was determined using a SpectraScan PR650 spectroradiometer and the results are illustrated in FIGS. 2a and 2b.

Sample E exhibited efficiencies of 8 lm/W and 10.7 cd/A, Sample G exhibited efficiencies of 3.8 lm/W and 7.78 cd/A, and Sample F exhibited efficiencies of 6.8 lm/W and 9.2 cd/A. Thus, Sample E according to the present invention had an increase in efficiency of at least 12% compared to Sample F and Sample G which used a commercial hole injection material.

Accordingly, it can be seen that the organic electroluminescent device having a HIL composed of the composition of the present invention, particularly, Sample E, has good luminous efficiency.

Experimental Example 4

Evaluation of Lifetime

Figure 3:
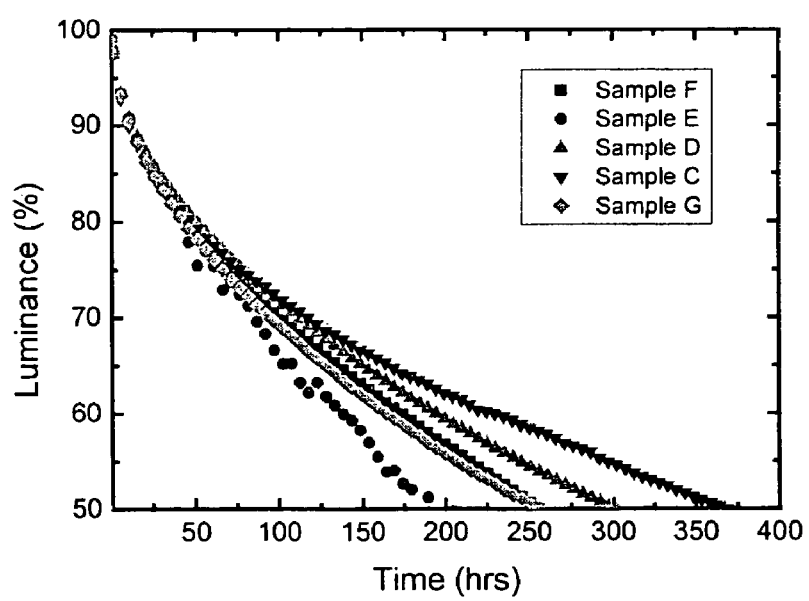
FIG. 3 is a graph illustrating the lifetime characteristics of organic electroluminescent devices manufactured in Example 1 and Comparative Example 1.

The lifetime of Sample C to Sample G was investigated and the results are illustrated in FIG. 3. The lifetime was determined by measuring luminance with respect to time using a photodiode and was represented by a time at which an initial luminance was reduced to 50%.

Sample C had a lifetime of about 365 hours and Sample F and Sample G had a lifetime of about 250 hours when they were operated at an initial luminance of 800 cd/m². Thus, the organic electroluminescent device of the present invention, particularly, Sample C, had a lifetime approximately 46% higher than that of the conventional organic electroluminescent device.

As described above, the composition of the present invention is prepared by doping a conducting polymer with an ionomer which has a low water uptake, has a low content of by-products produced by the decomposition reaction with electrons, and can crosslink with the conducting polymer. Thus, an opto-electronic device including the composition may have improved efficiency and lifetime.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition, comprising:

a conducting polymer;

a first ionomer represented by one of Formulae (3), (6), (8), (9), (10), (11) and (13)

(3)

where m is a number of 1 to 10,000,000;

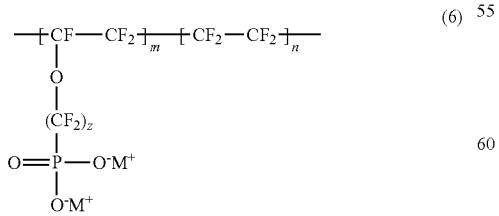

(6)

where $0 < m \leq 10{,}000{,}000$, $0 \leq n < 10{,}000{,}000$, z is a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

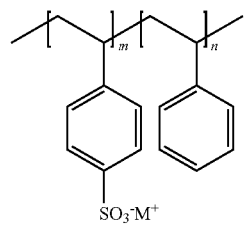

(8)

where $0 < m \leq 10{,}000{,}000$, $0 < n < 10{,}000{,}000$, and $M^+$ is $Na^+$, $K^+$, $Li^+$, $H^+$, $CH_3(CH_2)_aNH_3^+$ in which a is an integer of 0 to 50, or $NH_4^+$;

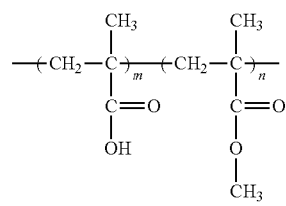

(9)

where $0 < m \leq 10{,}000{,}000$, and $0 < n < 10{,}000{,}000$;

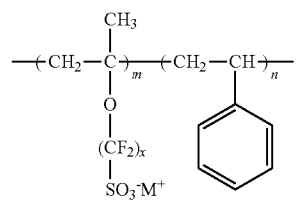

(10)

where $0 < m \leq 10{,}000{,}000$, $0 \leq n \leq 10{,}000{,}000$, x is a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

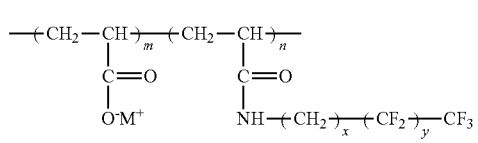

(11)

where $0 < m \leq 10{,}000{,}000$, $0 < n < 10{,}000{,}000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

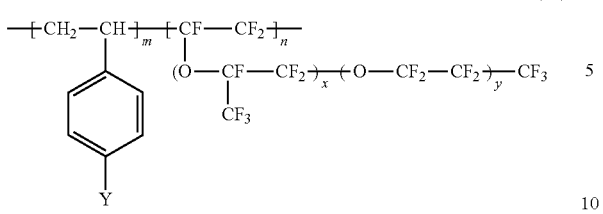

where $0 < m \leq 10,000,000$, $0 < n < 10,000,000$, each of x and y is independently a number of 0 to 20, Y is $-SO_3^-M^+$, $-COO^-M^+$, $-SO_3^-NHSO_2CF3^+$, or $-PO_3^{2-}(M^+)_2$, and $M^+$ is $Na^+$, $K^+$, $Li^+$, $H^+$, $CH_3(CH_2)_aNH_3^+$ in which a is an integer of 0 to 50, or $NH_4^+$; and at least one of a physical crosslinking agent and a chemical crosslinking agent.

2. The composition of claim 1, wherein the amount of the first ionomer is 100 to 5,000 parts by weight based on 100 parts by weight of the conducting polymer.

3. The composition of claim 1, wherein the composition further comprises a second ionomer represented by Formula (1), and the first ionomer and the second ionomer are different from each other:

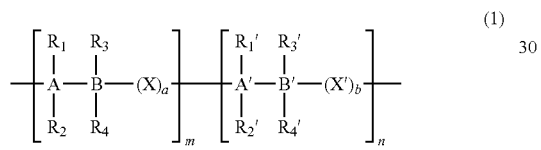

where $0 < m \leq 10,000,000$;
$0 \leq n \leq 10,000,000$;
$0 \leq a \leq 20$;
$0 \leq b \leq 20$;

each of A, B, A', and B' is independently selected from the group consisting of C, Si, Ge, Sn, and Pb;

each of $R_1$, $R_2$, $R_3$, $R_4$, $R_1'$, $R_2'$, $R_3'$, and $R_4'$ is independently selected from the group consisting of a hydrogen atom, a halogen atom, a nitro group, a substituted or unsubstituted amino group, a cyano group, a substituted or unsubstituted C1-C30 alkyl group, a substituted or unsubstituted C1-C30 heteroalkyl group, a substituted or unsubstituted C1-C30 alkoxy group, a substituted or unsubstituted C1-C30 heteroalkoxy group, a substituted or unsubstituted C6-C30 aryl group, a substituted or unsubstituted C6-C30 arylalkyl group, a substituted or unsubstituted C6-C30 aryloxy group, a substituted or unsubstituted C2-C30 heteroaryl group, a substituted or unsubstituted C2-C30 heteroarylalkyl group, a substituted or unsubstituted C2-C30 heteroaryloxy group, a substituted or unsubstituted C5-C20 cycloalkyl group, a substituted or unsubstituted C2-C30 heterocycloalkyl group, a substituted or unsubstituted C1-C30 alkylester group, a substituted or unsubstituted C1-C30 heteroalkylester group, a substituted or unsubstituted C6-C30 arylester group, and a substituted or unsubstituted C2-C30 heteroarylester group, and at least one of $R_1$, $R_2$, $R_3$, and $R_4$ is an ionic group or includes an ionic group;

each of X and X' is independently selected from the group consisting of a single bond, O, S, a substituted or unsubstituted C1-C30 alkylene group, a substituted or unsubstituted C1-C30 heteroalkylene group, a substituted or unsubstituted C6-C30 arylene group, a substituted or unsubstituted C6-C30 arylalkylene group, a substituted or unsubstituted C2-C30 heteroarylene group, a substituted or unsubstituted C2-C30 heteroarylalkylene group, a substituted or unsubstituted C5-C20 cycloalkylene group, a substituted or unsubstituted C5-C30 heterocycloalkylene group, a substituted or unsubstituted C6-C30 arylester group, and a substituted or unsubstituted C2-C30 heteroarylester group; and at least one of $R_1$, $R_2$, $R_3$, and $R_4$ is a hydrophobic functional group having a halogen element when n is 0.

4. The composition of claim 3, wherein the second ionomer is a hydrocarbon, fluorocarbon or silicone polymer represented by Formula (1) in which n=0 and $0 < m < 10,000,000$.

5. The composition of claim 4, wherein the second ionomer is a perfluorocarbon.

6. The composition of claim 4, wherein the second ionomer comprises ionomers represented by Formulae (2) to (7) and (10) to (13):

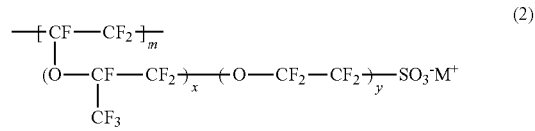

where m is a number of 1 to 10,000,000, each of x and y is dependently a number of 0 to 10, and $M^+$ is $Na^+$, $K^+$, $Li^+$, $H^+$, $CH_3(CH_2)_aNH_3^+$ in which a is an integer of 0 to 50, or $NH_4^+$;

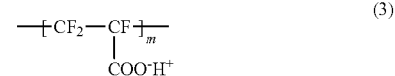

where m is a number of 1 to 10,000,000;

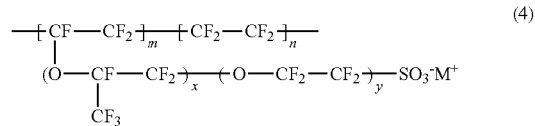

where $0 < m \leq 10,000,000$, $0 \leq n < 10,000,000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

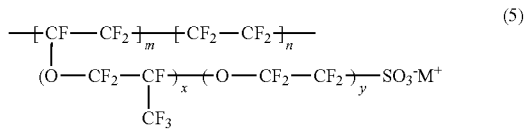

where $0 < m \leq 10,000,000$, $0 \leq n < 10,000,000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

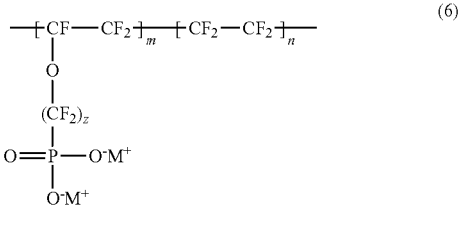

(6)

where $0 < m \leq 10{,}000{,}000$, $0 \leq n < 10{,}000{,}000$, z is a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

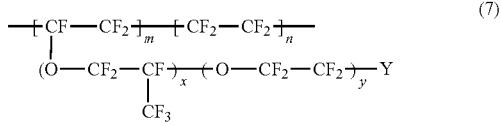

(7)

where $0 < m \leq 10{,}000{,}000$, $0 \leq n < 10{,}000{,}000$, each of x and y is independently a number of 0 to 20, Y is $-COO^-M^+$, $-SO_3^-NHSO_2CF_3^+$, or $-PO_3^{2-}(M^+)_2$, and $M^+$ is $Na^+$, $K^+$, $Li^+$, $H^+$, $CH_3(CH_2)_aNH_3^+$ in which a is an integer of 0 to 50, or $NH_4^+$;

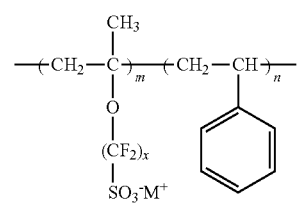

(10)

where $0 < m \leq 10{,}000{,}000$, $0 \leq n < 10{,}000{,}000$, x is a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

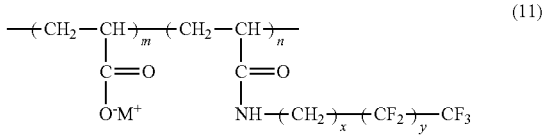

(11)

where $0 < m \leq 10{,}000{,}000$, $0 < n < 10{,}000{,}000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

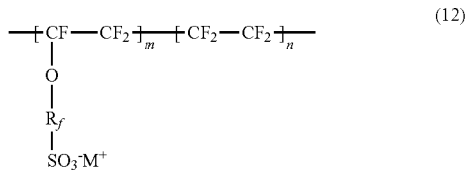

(12)

where $0 < m \leq 10{,}000{,}000$, $0 \leq n < 10{,}000{,}000$, $R_f$ is $-(CF_2)_c-$ in which c is an integer of 1 to 50, but is not 2, $-(CF_2CF_2O)_dCF_2CF_2-$ in which d is an integer of 1 to 50, or $-(CF_2CF_2CF_2O)_eCF_2CF_2-$ in which e is an integer of 1 to 50, and $M^+$ is $Na^+$, $K^+$, $Li^+$, $H^+$, $CH_3(CH_2)_aNH_3^+$ in which a is an integer of 0 to 50, or $NH_4^+$;

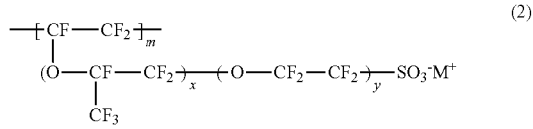

(2)

where $0 < m \leq 10{,}000{,}000$, $0 < n < 10{,}000{,}000$, each of x and y is independently a number of 0 to 20, Y is $-SO_3^-M^+$, $-COO^-M^+$, $-SO_3^-NHSO_2CF_3^+$, or $-PO_3^{2-}(M^+)_2$, and $M^+$ is $Na^+$, $K^+$, $Li^+$, $H^+$, $CH_3(CH_2)_aNH_3^+$ in which a is an integer of 0 to 50, or $NH_4^+$.

7. The composition of claim 4, wherein the second ionomer comprises ionomers represented by Formulae (8) and (9):

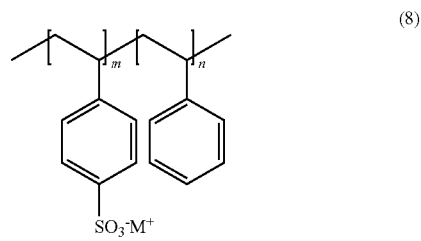

(8)

where $0 < m \leq 10{,}000{,}000$, $0 < n < 10{,}000{,}000$, and $M^+$ is $Na^+$, $K^+$, $Li^+$, $H^+$, $CH_3(CH_2)_aNH_3^+$ in which a is an integer of 0 to 50, or $NH_4^+$; and

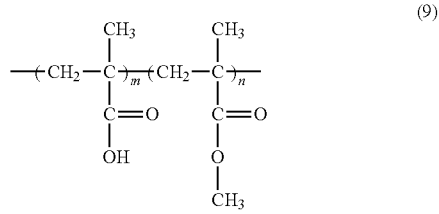

(9)

where $0 < m \leq 10{,}000{,}000$, and $0 < n < 10{,}000{,}000$.

8. The composition of claim 1, wherein the conducting polymer is at least one polymer selected from the group consisting of polyethylenedioxythiopene (PEDOT), polyaniline, polypyrrole, polyacetylene, polyphenylene, polyphenylenevinylene, polythiopene, and a copolymer thereof.

9. The composition of claim 3, wherein the ionic group includes an anionic group selected from the group consisting of $PO_3^{2-}$, $SO_3^-$, $COO^-$, $I^-$, and $CH_3COO^-$, and a cation group capable of forming a couple with the anionic group, the cation group selected from the group consisting of a metal ion and an organic ion, the metal ion is selected from the group consisting of $Na^+$, $K^+$, $Mg^{+2}$, $Zn^{+2}$, and $Al^{+3}$, the organic ion is selected from the group consisting of $H^+$, $CH_3(CH_2)_aNH_3^+$ in which a is an integer of 0 to 50, or $NH_4^+$.

10. The composition of claim 3, wherein the hydrophobic functional group is a halogen element.

11. The composition of claim 3, wherein the hydrophobic functional group is fluorine.

12. The composition of claim 1, wherein the physical crosslinking agent has a hydroxy group (—OH).

13. The composition of claim 1, wherein the physical crosslinking agent is a compound selected from the group consisting of glycerol, butanol, polyvinylalcohol, polyethyleneglycol, polyethyleneimine, and polyvinylpyrrolidone.

14. The composition of claim 1, wherein the chemical crosslinking agent is a compound selected from the group consisting of tetraethyloxysilane (TEOS), polyaziridine, melamine-based materials, and epoxy-based materials.

15. The composition of claim 1, wherein the content of non-ionic monomer units in the first ionomer is 1 to 99 mol %, based on the total content of monomer units of the first ionomer.

16. A conducting film formed from the composition of claim 1.

17. An opto-electronic device comprising the conducting film of claim 16.

18. An electronic device comprising the conducting film of claim 16.

19. A device having a conducting film, the conducting film formed of a conducting polymer doped with a first ionomer represented by Formulae (3), (6), (8), (9), (10), (11) and (13)

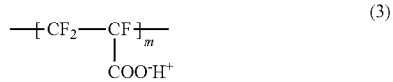

(3)

where m is a number of 1 to 10,000,000;

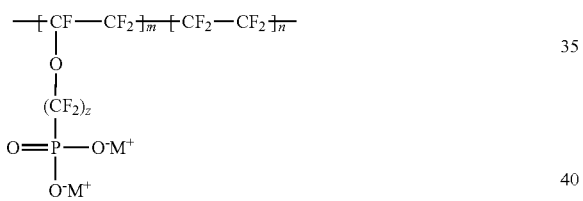

where $0<m\leq10,000,000$, $0\leq n<10,000,000$, z is a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

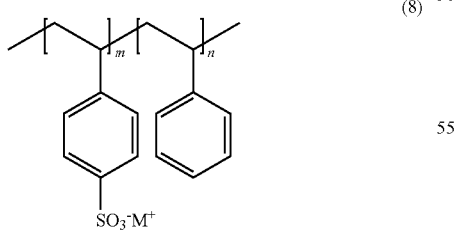

(8)

where $0<m\leq10,000,000$, $0<n<10,000,000$, and $M^+$ is $Na^+$, $K^+$, $Li^+$, $H^+$, $CH_3(CH_2)_aNH_3^+$ in which a is an integer of 0 to 50, or $NH_4^+$;

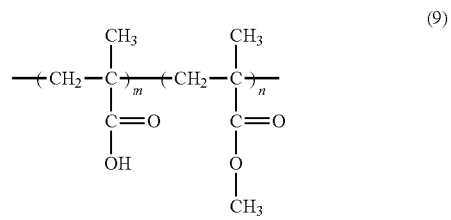

(9)

where $0<m\leq10,000,000$, and $0<n<10,000,000$;

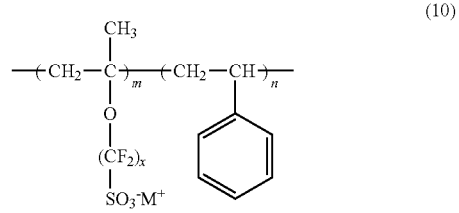

(10)

where $0<m\leq10,000,000$, $0\leq n<10,000,000$, x is a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

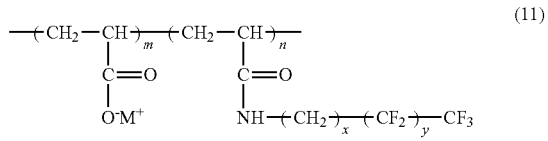

(11)

where $0<m\leq10,000,000$, $0<n<10,000,000$, each of x and y is independently a number of 0 to 20, and $M^+$ is $Na^+$, $K^+$, $Li^+$, $H^+$, $CH_3(CH_2)_aNH_3^+$ in which a is an integer of 0 to 50, or $NH_4^+$;

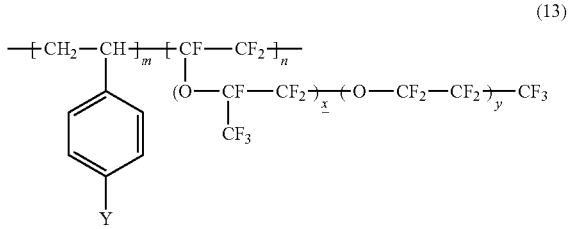

(13)

where $0<m\leq10,000,000$, $0<n<10,000,000$, each of x and y is independently a number of 0 to 20, Y is $-SO_3^-M^+$, $-COO^-M^+$, $-SO_3^-NHSO_2CF3^+$, or $-PO_3^{2-}(M^+)_2$, and $M^+$ is $Na^+$, $K^+$, $Li^+$, $H^+$, $CH_3(CH_2)_aNH_3^+$ in which a is an integer of 0 to 50, or $NH_4^+$.

20. The device of claim 19, wherein the device is an organic electroluminescent device, and the conducting film is used as a charge injection layer to inject holes or electrons into a light emitting layer.

21. The device of claim 19, wherein the device is an organic solar cell, and the conducting film is used as an electrode or an electrode buffer layer.

22. The device of claim 19, wherein the device is an organic transistor, and the conducting film is used an electrode material.

23. An organic electroluminescent device, comprising:
a first electrode;
a second electrode;
an emissive layer between the first electrode and the second electrode; and
a hole injection layer between the first electrode and the emissive layer, the hole injection layer formed of a conducting polymer doped with a first ionomer represented by Formulae (3), (6), (8), (9), (10), (11) and (13)

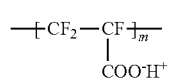
(3)

where m is a number of 1 to 10,000,000;

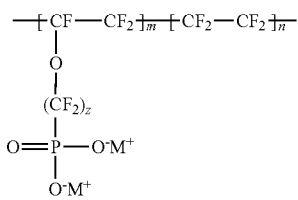
(6)

where $0<m \leqq 10,000,000$, $0 \leqq n<10,000,000$, z is a number of 0 to 20, and $M^+$ is $Na^+$, $K^+$, $Li^+$, $H^+$, $CH_3(CH_2)_a NH_3^+$ in which a is an integer of 0 to 50, or $NH_4^+$;

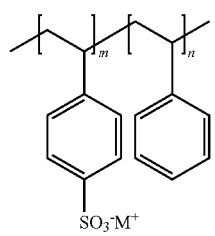
(8)

where $0<m \leqq 10,000,000$, $0<n<10,000,000$, and $M^+$ is $Na^+$, $K^+$, $Li^+$, $H^+$, $CH_3(CH_2)_a NH_3^+$ in which a is an integer of 0 to 50, or $NH_4^+$;

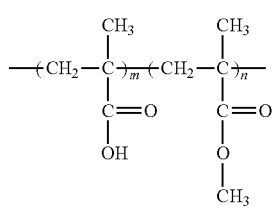
(9)

where $0<m \leqq 10,000,000$, and $0<n<10,000,000$;

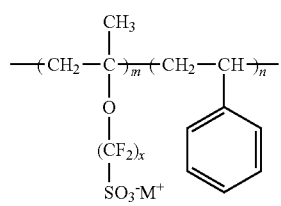
(10)

where $0<m \leqq 10,000,000$, $0 \leqq n<10,000,000$, x is a number of 0 to 20, and $M^+$ is $Na^+$, $K^+$, $Li^+$, $H^+$, $CH_3(CH_2)_a NH_3^+$ in which a is an integer of 0 to 50, or $NH_4^+$;

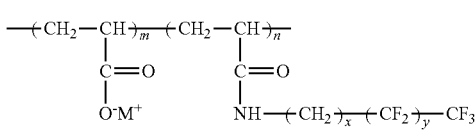
(11)

where $0<m \leqq 10,000,000$, $0<n<10,000,000$, each of x and y is independently a number of 0 to 20, and $M^+$ is $Na^+$, $K^+$, $Li^+$, $H^+$, $CH_3(CH_2)_a NH_3^+$ in which a is an integer of 0 to 50, or $NH_4^+$;

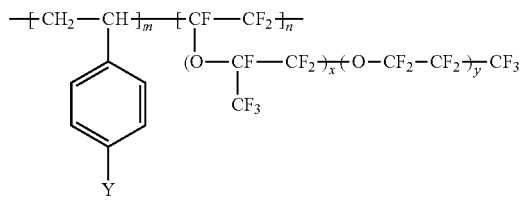
(13)

where $0<m \leqq 10,000,000$, $0<n<10,000,000$, each of x and y is independently a number of 0 to 20, Y is $-SO_3^- M^+$, $-COO^- M^+$, $-SO_3^- NHSO_2 CF_3^+$, or $-PO_3^{2-}(M^+)_2$, and $M^+$ is $Na^+$, $K^+$, $Li^+$, $H^+$, $CH_3(CH_2)_a NH_3^+$ in which a is an integer of 0 to 50, or $NH_4^+$.

24. The composition of claim 1, wherein the first ionomoer is represented by Formula (3).
25. The composition of claim 1, wherein the first ionomoer is represented by Formula (6).
26. The composition of claim 1, wherein the first ionomoer is represented by Formula (8).
27. The composition of claim 1, wherein the first ionomoer is represented by Formula (9).
28. The composition of claim 1, wherein the first ionomoer is represented by Formula (10).
29. The composition of claim 1, wherein the first ionomoer is represented by Formula (11).
30. The composition of claim 1, wherein the first ionomoer is represented by Formula (13).

* * * * *